(12) United States Patent
Imamura et al.

(10) Patent No.: US 8,515,363 B2
(45) Date of Patent: Aug. 20, 2013

(54) SYSTEMS AND METHODS FOR PROVIDING A REDUCED POWER AMPLIFIER TRANSMISSION MODE

(75) Inventors: Kimihiko Imamura, Vancouver, WA (US); Kenneth James Park, Cathlamet, WA (US); John M. Kowalski, Camas, WA (US); Sayantan Choudhury, Vancouver, WA (US)

(73) Assignee: Sharp Kabushiki Kaisha, Osaka (JP)

(*) Notice: Subject to any disclaimer, the term of this patent is extended or adjusted under 35 U.S.C. 154(b) by 536 days.

(21) Appl. No.: 12/488,431

(22) Filed: Jun. 19, 2009

(65) Prior Publication Data

US 2010/0323753 A1 Dec. 23, 2010

(51) Int. Cl.
*H04B 1/04* (2006.01)

(52) U.S. Cl.
USPC ............................................. 455/101; 455/103

(58) Field of Classification Search
USPC ................ 370/326, 336; 375/260; 455/522, 455/101, 103
See application file for complete search history.

(56) References Cited

U.S. PATENT DOCUMENTS

| 7,430,168 | B2 | 9/2008 | Yamaura et al. |
| 7,519,035 | B2 | 4/2009 | Kowalski et al. |
| 7,519,128 | B2 | 4/2009 | Seto et al. |
| 2004/0146018 | A1 | 7/2004 | Walton et al. |
| 2008/0151798 | A1 | 6/2008 | Camp |
| 2009/0093281 | A1 | 4/2009 | Demirhan et al. |
| 2009/0129304 | A1 | 5/2009 | Kim et al. |
| 2009/0130972 | A1 | 5/2009 | Andersen et al. |
| 2009/0316621 | A1* | 12/2009 | Lane et al. ..................... 370/326 |
| 2010/0093385 | A1 | 4/2010 | Kazmi et al. |
| 2012/0008577 | A1* | 1/2012 | Han et al. ..................... 370/329 |

FOREIGN PATENT DOCUMENTS

| WO | 2006/137282 | 12/2006 |
| WO | 2008/076024 | 6/2008 |
| WO | 2008/079455 | 7/2008 |
| WO | 2008/153081 | 12/2008 |

OTHER PUBLICATIONS

Written Opinion issued for International Patent Application No. PCT/JP2010/059885 on Jun. 28, 2011.
Avago Technologies, "WS2512-TR1G Data Sheet," http://www.avagotech.com/docs/AV02-0168EN, Jun. 12, 2009.
3GPP TS 36.213 V8.6.0, "Evolved Universal Terrestrial Radio Access (E-UTRA) Physical layer procedures," Mar. 2009.
3GPP TS 36.321 V8.5.0, "Evolved Universal Terrestrial Radio Access (E-UTRA) Medium Access Control (MAC); Protocol specification," Mar. 2009.
3GPP TS 36.331 V8.5.0, "Evolved Universal Terrestrial Radio Access (E-UTRA) Radio Resource Control (RRC); Protocol specification," Mar. 2009.
3GPP TS 23.401 V9.0.0, "Evolved Universal Terrestrial Radio Access (E-UTRA) Access," Mar. 2009.
International Search Report issued for International Patent Application No. PCT/JP2010/059885 on Jul. 27, 2010.

* cited by examiner

*Primary Examiner* — Phuoc Doan
(74) *Attorney, Agent, or Firm* — Austin Rapp & Hardman

(57) ABSTRACT

A user equipment (UE) that supports multiple antenna transmission via multiple power amplifiers may operate in a reduced power amplifier (PA) mode. When operating in the reduced PA mode, a subset of the UE's power amplifiers are used to transmit uplink signals. A UE may send a preference signal to an e-Node B to request that the UE operate in the reduced PA mode.

20 Claims, 12 Drawing Sheets

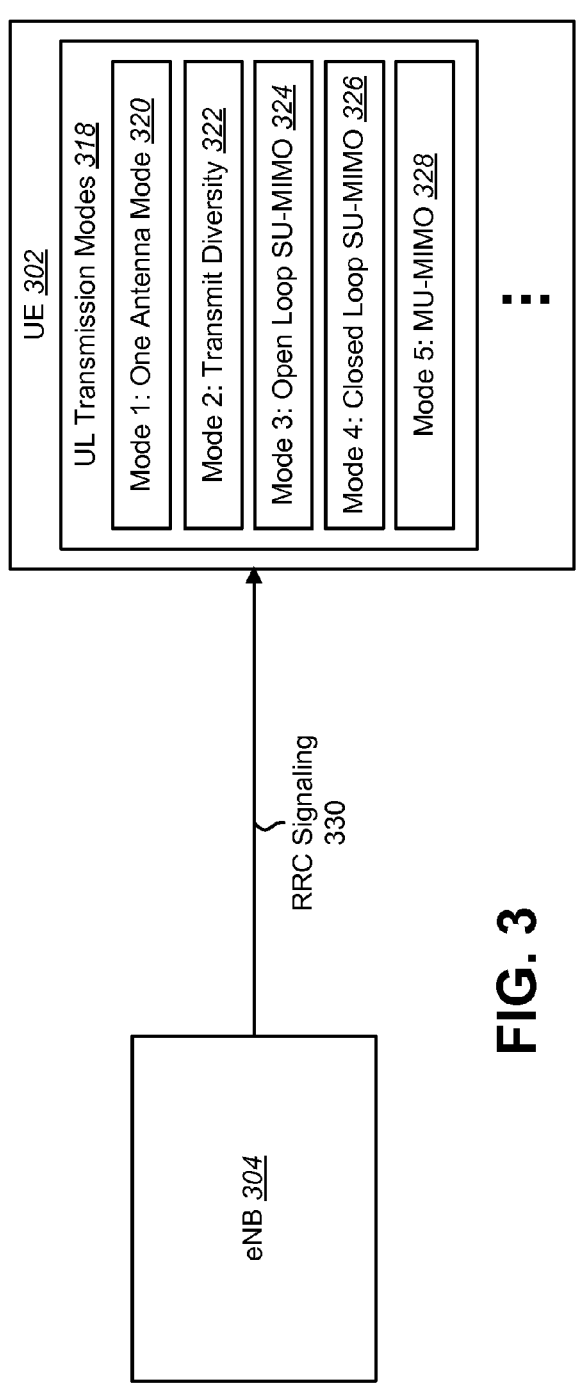
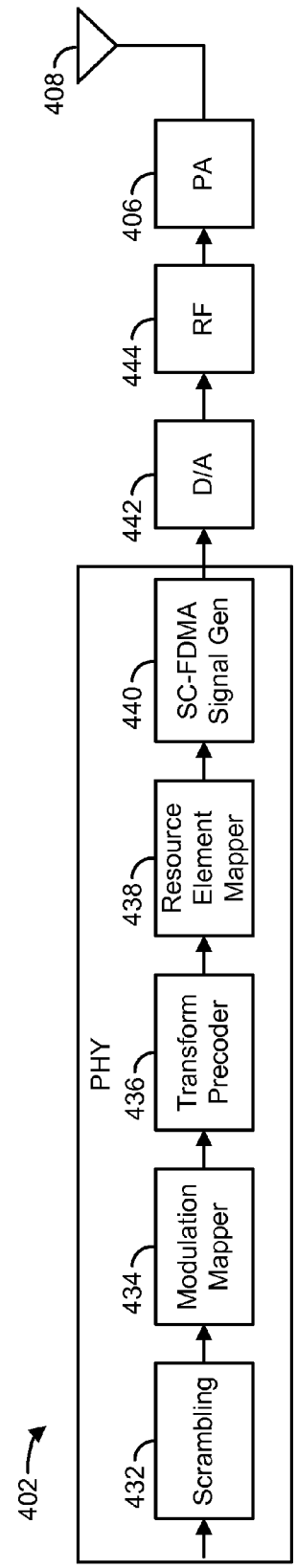
FIG. 3
FIG. 4

SYSTEMS AND METHODS FOR PROVIDING A REDUCED POWER AMPLIFIER TRANSMISSION MODE

TECHNICAL FIELD

The present disclosure relates generally to wireless communication systems. More specifically, the present disclosure relates to systems and methods for providing a reduced power amplifier (PA) transmission mode.

BACKGROUND

Wireless communication systems have become an important means by which many people worldwide have come to communicate. A wireless communication system may provide communication for a number of mobile stations, each of which may be serviced by a base station.

The 3rd Generation Partnership Project, also referred to as "3GPP," is a collaboration agreement that aims to define globally applicable technical specifications and technical reports for third generation wireless communication systems. The 3GPP may define specifications for the next generation mobile networks, systems, and devices. In 3GPP specifications, a mobile station is typically referred to as a user equipment (UE), and a base station is typically referred to as a Node B or an evolved Node B (eNB).

3GPP Long Term Evolution (LTE) is the name given to a project to improve the Universal Mobile Telecommunications System (UMTS) mobile phone or device standard to cope with future requirements. In one aspect, UMTS has been modified to provide support and specification for the Evolved Universal Terrestrial Radio Access (E-UTRA) and Evolved Universal Terrestrial Radio Access Network (E-UTRAN). LTE-Advanced is the next generation of LTE.

In LTE release 8, the PUSCH (Physical Uplink Shared Channel) supports only one transmission mode, i.e., one antenna mode. But in LTE-Advanced, the 3GPP is attempting to specify several transmission modes, i.e., TxD (transmit diversity), SU-MIMO (single user-MIMO) and MU-MIMO (multi-user-MIMO) for PUSCH. Supporting SU-MIMO in LTE-Advanced means that at least some UEs have to support two power amplifiers.

BRIEF DESCRIPTION OF THE DRAWINGS

FIG. 3 illustrates one example of a reduced PA mode, namely a one antenna mode;

FIG. 4 illustrates a UE that is configured to operate in the one antenna mode;

DETAILED DESCRIPTION

Figure 1:
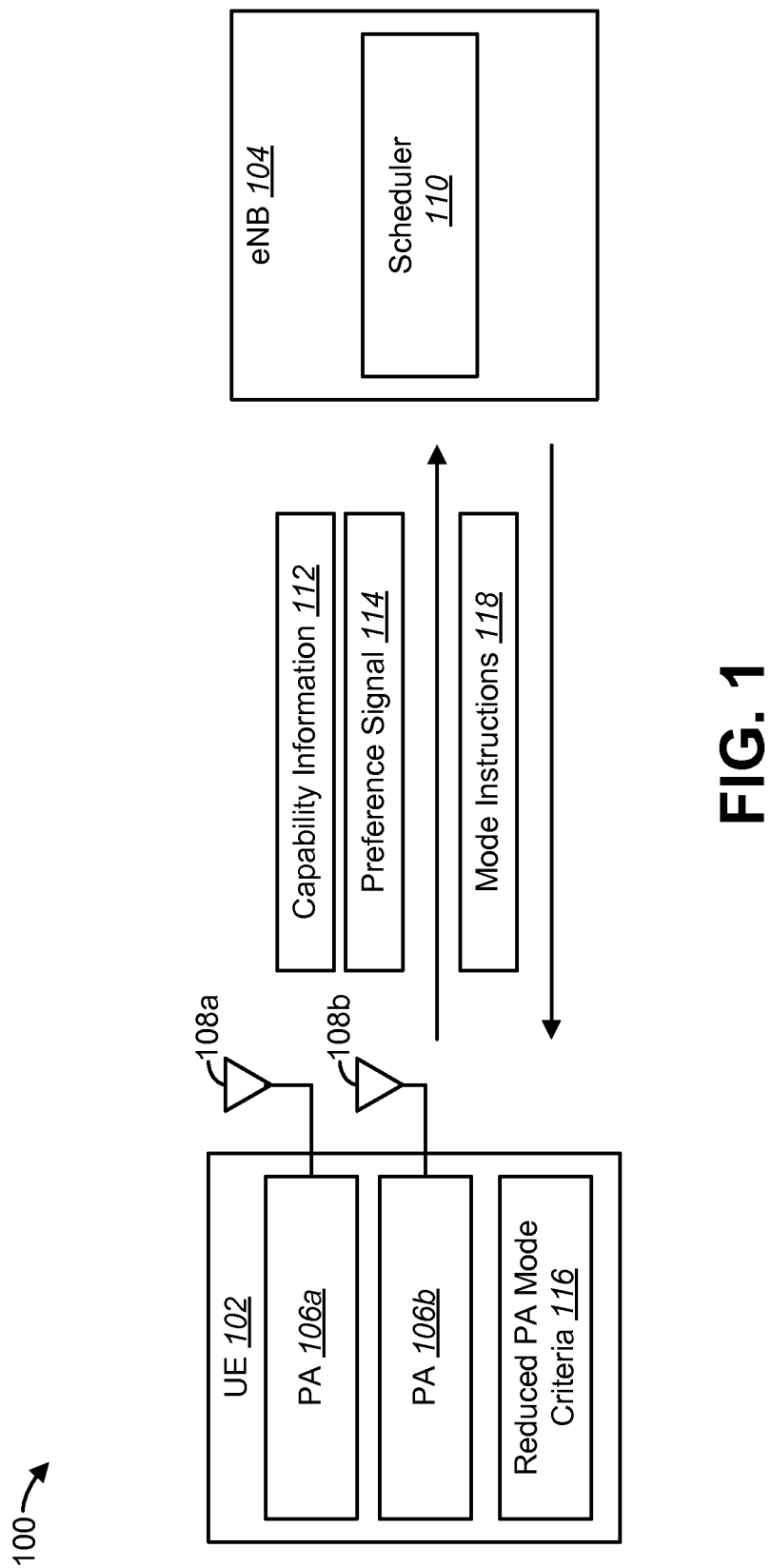
FIG. 1 illustrates a system for reducing power consumption in a UE.

The present disclosure relates to a "reduced power amplifier (PA) mode" for user equipment (UE) that supports multiple antenna transmission via multiple PAs. When operating in the reduced PA mode, a subset of the UE's power amplifiers are used to transmit uplink signals. Reducing the number of power amplifiers that are utilized by a UE may significantly reduce the amount of power that is consumed by the UE, and therefore extend the life of the UE's battery.

A user equipment (UE) is disclosed. The UE includes multiple power amplifiers. The UE also includes a processor, memory in electronic communication with the processor, and instructions stored in the memory. The instructions are executable by the processor to support multiple antenna transmission via the multiple power amplifiers. The instructions are also executable to operate in a reduced power amplifier (PA) mode. A subset of the multiple PAs are used to transmit uplink signals when the UE operates in the reduced PA mode.

The reduced PA mode may be an uplink transmission mode. The uplink transmission mode may be a one antenna mode. Alternatively, the uplink transmission mode may be an antenna selection mode. Alternatively, the reduced PA mode may be a radio access technology (RAT) mode, and the RAT mode may be a Long Term Evolution (LTE) mode.

Only one of the multiple power amplifiers may be used when the UE operates in the reduced PA mode. Alternatively, more than one of the multiple power amplifiers may be used when the UE operates in the reduced PA mode.

The instructions may also be executable to send a preference signal to an e-Node B (eNB). The preference signal may include a request for the UE to operate in the reduced PA mode. The preference signal may be sent via Media Access Control (MAC) control signaling, via Radio Resource Control (RRC) connection re-establishment signaling, via UE capability transfer signaling, via a measurement report, via Non-Access Stratum (NAS) control signaling, etc. The preference signal may include at least one of UE type, battery status, and application type.

The instructions may also be executable to send capability information to an eNB via UE capability transfer signaling. The instructions may also be executable to implicitly send capability information to an eNB. The instructions may also be executable to create a preference signal based on evaluating reduced PA mode criteria. The reduced PA mode criteria may include pathloss information, battery status, an indicator of an E911 call, etc.

A method that is implemented by a user equipment (UE) is disclosed. The method includes supporting multiple antenna transmission via multiple power amplifiers. The method also includes operating in a reduced power amplifier (PA) mode, wherein a subset of the multiple PAs are used to transmit uplink signals when the UE operates in the reduced PA mode. The reduced PA mode may be at least one of a one antenna mode, an antenna selection mode, and a Long Term Evolution (LTE) mode.

An enhanced Node B (eNB) is disclosed. The eNB includes a processor, memory in electronic communication with the processor, and instructions stored in the memory. The instructions are executable by the processor to determine that a user equipment (UE) should operate in a reduced power amplifier (PA) mode based on at least one of a preference signal received from the UE, capability information received from the UE, and eNB measurement results. The instructions are also executable by the processor to instruct the UE to transition to the reduced PA mode.

For clarity, the systems and methods disclosed herein will be described using terminology from the 3GPP LTE and LTE-Advanced standards. However, the scope of the present disclosure should not be limited in this regard. The systems and methods may be utilized in other types of wireless communication systems.

FIG. 1 illustrates a system 100 for reducing power consumption in a UE 102. The UE 102 is an electronic device that may be used for voice and/or data communication over a wireless communication network, such as a cellular network. The UE 102 may be a cellular phone, a smart phone, a personal digital assistant (PDA), a card in a laptop or personal computer, etc.

An evolved Node B (eNB) 104 facilitates wireless communication between the UE 102 and a network. The eNB 104 is a fixed station that contains radio frequency transmitters and receivers that are used to communicate directly with UEs 102, which may move freely around the eNB 104. Signals that are transmitted from the UE 102 to the eNB 104 are referred to as uplink signals, and signals that are transmitted from the eNB 104 to the UE 102 are referred to as downlink signals.

The UE 102 includes multiple power amplifiers 106 and multiple transmit antennas 108. A first transmit antenna 108a and a second transmit antenna 108b are specifically shown in FIG. 1. A power amplifier (PA) 106 may be used to amplify a signal from a transmitter for transmission through a transmit antenna 108.

The scheduler 110, capability information 112, preference signal 114, reduced PA mode criteria 116, and mode instructions 118 will be discussed below in connection with FIG. 2.

Figure 2:
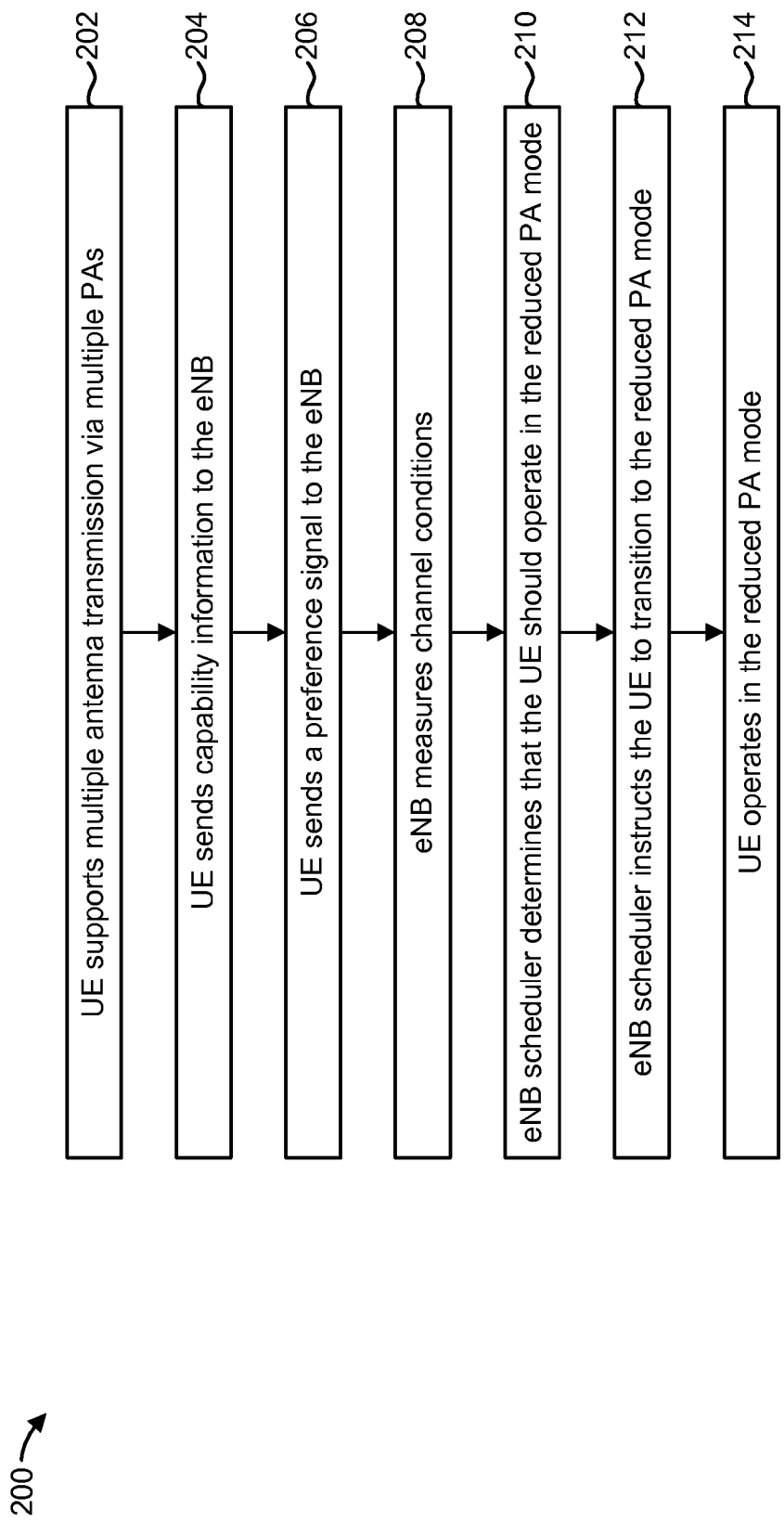
FIG. 2 illustrates a method for reducing power consumption in a UE.

FIG. 2 illustrates a method 200 for reducing power consumption in a UE 102. The UE 102 supports 202 multiple antenna 108 transmission via the multiple PAs 106. However, the UE 102 is also capable of operating in a reduced PA mode, in which a subset of the multiple PAs 106 are used to transmit uplink signals. For example, only one of the PAs 106 may be used when the UE 102 operates in the reduced PA mode. Alternatively, more than one (but fewer than all) of the PAs 106 may be used when the UE 102 operates in the reduced PA mode. For example, if the UE 102 has four PAs 106, then the UE 102 may utilize one, two, or three PAs 106 when operating in the reduced PA mode.

The UE 102 may send 204 capability information 112 to the eNB 104. The capability information 112 may indicate to the eNB 104 that the UE 102 is capable of operating in the reduced PA mode. The scheduler 110 at the eNB 104 may decide whether or not the UE 102 operates in the reduced PA mode. Under some circumstances, the UE 102 may send 206 a preference signal 114 to the eNB 104. The preference signal 114 may include a request for the UE 102 to operate in the reduced PA mode. The UE 102 may create the preference signal 114 based on evaluating reduced PA mode criteria 116 (this will be discussed in greater detail below). Also, as part of deciding whether the UE 102 should operate in the reduced PA mode, the eNB 104 may measure 208 channel conditions.

At some point, the eNB scheduler 110 may determine 210 that the UE 102 should operate in the reduced PA mode. This decision may be based on the capability information 112, the preference signal 114, and/or the results from the eNB's 104 measurement 208 of channel conditions. The eNB scheduler 110 may then instruct 212 the UE 102 to transition to the reduced PA mode. This may involve sending a mode instruction 118 to the UE 102. In response, the UE 102 may operate 214 in the reduced PA mode.

FIG. 3 illustrates one example of a reduced PA mode, namely a one antenna mode 320. A UE 302 may be capable of operating in multiple uplink transmission modes 318, including the one antenna mode 320, as well as a transmit diversity mode 322, an open loop SU-MIMO (single-user multiple-input multiple-output) mode 324, a closed loop SU-MIMO mode 326, a MU-MIMO (multiple-user MIMO) mode 328, etc. An eNB 304 may configure the UE 302 to operate in a particular uplink transmission mode 318 via RRC (radio resource control) signaling 330, similar to the procedure for the release 8 LTE downlink.

FIG. 4 illustrates a UE 402 that is configured to operate in the one antenna mode 320. The UE 402 may include a scrambling component 432, a modulation mapper 434, a transform precoder 436, a resource element mapper 438, an SC-FDMA signal generator 440, a digital-to-analog (D/A) converter 442, a radio frequency (RF) component 444, a PA 406, and a transmit antenna 408.

In the one antenna mode 320, the UE 402 uses only one D/A converter 442, one RF component 444, one PA 406, and one antenna 408 to transmit uplink signals. This is true even if the UE 402 has more than one D/A converter 442, more than one RF component 444, more than one PA 406, and/or more than one antenna 408.

Figure 5:
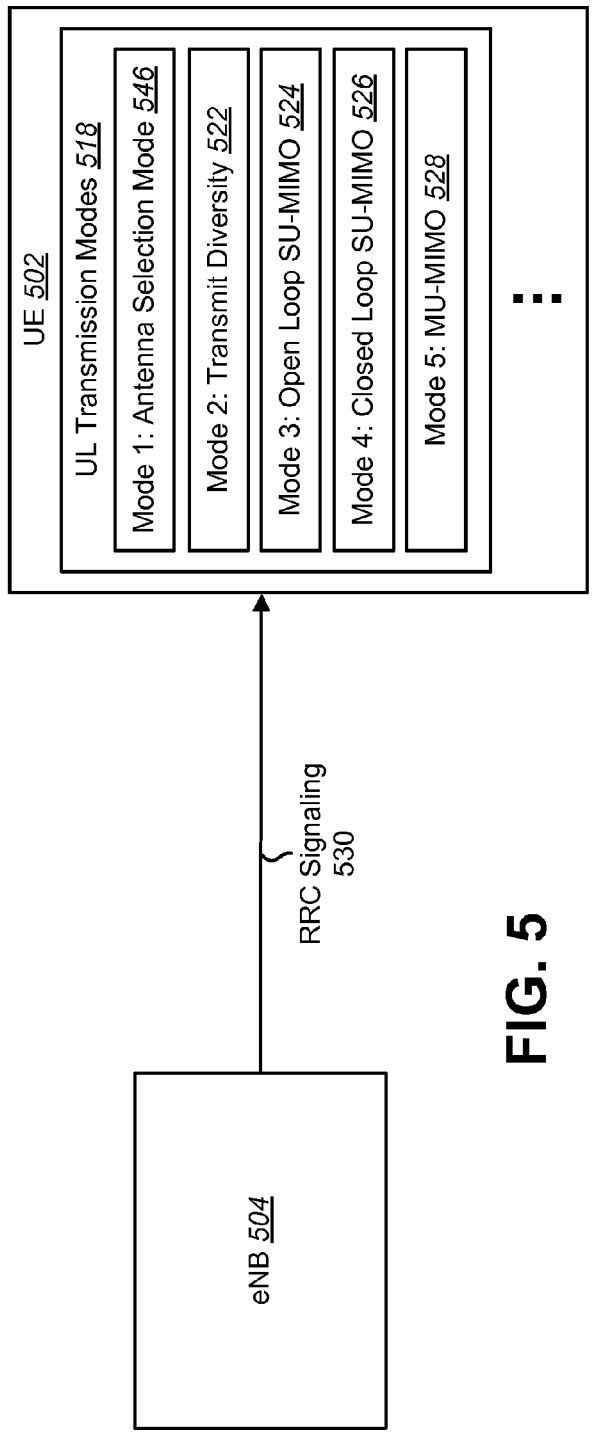
FIG. 5 illustrates another example of a reduced PA mode, namely an antenna selection mode.

FIG. 5 illustrates another example of a reduced PA mode, namely an antenna selection mode 546. A UE 502 may be capable of operating in multiple uplink transmission modes 518, including the antenna selection mode 546, as well as a transmit diversity mode 522, an open loop SU-MIMO mode 524, a closed loop SU-MIMO mode 526, a MU-MIMO mode 528, etc. An eNB 504 may configure the UE 502 to operate in a particular uplink transmission mode 518 via RRC signaling 530.

Figure 6:
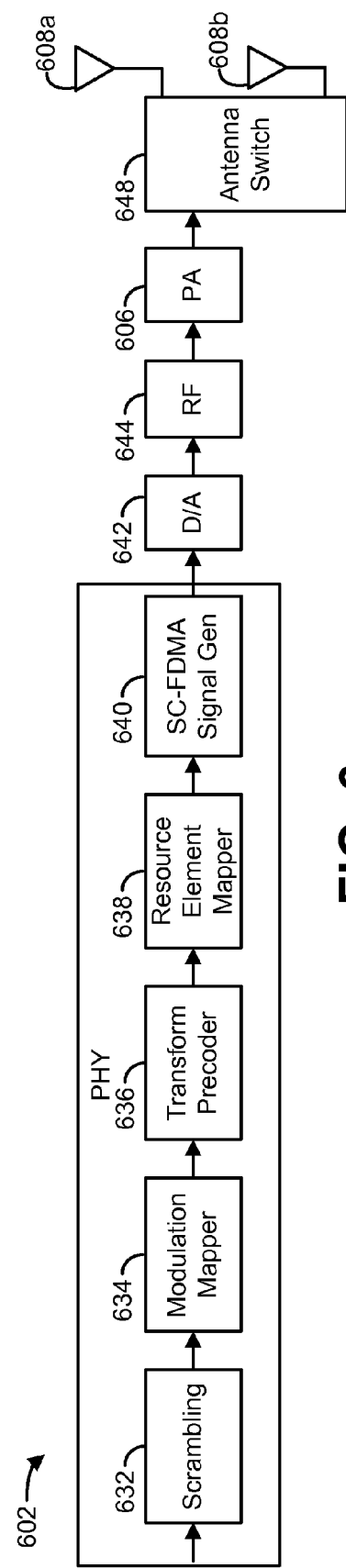
FIG. 6 illustrates a UE that is configured to operate in the antenna selection mode.

FIG. 6 illustrates a UE 602 that is configured to operate in the antenna selection mode 546. The UE 602 includes a scrambling component 632, a modulation mapper 634, a transform precoder 636, a resource element mapper 638, an SC-FDMA signal generator 640, a D/A converter 642, an RF component 644, a PA 606, an antenna switching module 648, and first and second transmit antennas 608a, 608b.

In the antenna selection mode 546, the UE 602 may use only one D/A converter 642, one RF component 644, one PA 606, and one antenna 608 to transmit uplink signals. This may be true even though the UE 602 has more than one antenna 608a, 608b. The UE 602 may switch the antenna 608a, 608b that is used to transmit uplink signals via the antenna switching module 648.

Figure 7:
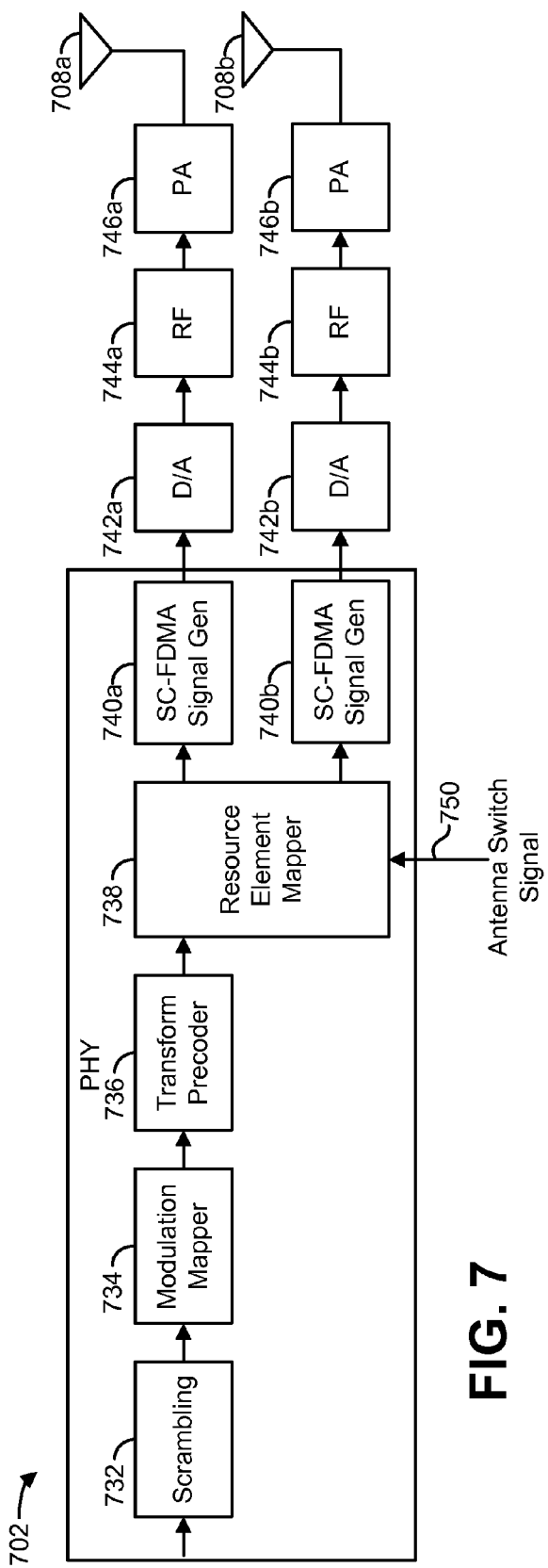
FIG. 7 illustrates another UE that is configured to operate in the antenna selection mode.

FIG. 7 illustrates another UE 702 that is configured to operate in the antenna selection mode 546. The UE 702 includes a scrambling component 732, a modulation mapper 734, a transform precoder 736, a resource element mapper 738, first and second SC-FDMA signal generators 740a, 740b, first and second D/A converters 742a, 742b, first and second RF components 744a, 744b, first and second PAs 746a, 746b, and first and second antennas 708a, 708b.

In the antenna selection mode 546, the UE 702 may use multiple D/A converters 742a, 742b, multiple RF components 744a, 744b, multiple PAs 746a, 746b and multiple antennas 708a, 708b to transmit uplink signals. However, the UE 702 may only use one D/A converter 742, one RF component 744, one PA 746, and one antenna 708 during a subframe. An antenna switch signal 750 may be applied to the resource element mapper 738 to determine whether the first set of components 740a, 742a, 744a, 746a, 708a or the second set of components 740b, 742b, 744b, 746b, 708b is used.

The UE 702 configuration shown in FIG. 7 requires the rapid on and off of PAs 746. Thus, the UE 702 configuration shown in FIG. 7 is suitable for dynamic switching, whereas the UE 602 configuration shown in FIG. 6 is suitable for semi-static switching.

Figure 8:
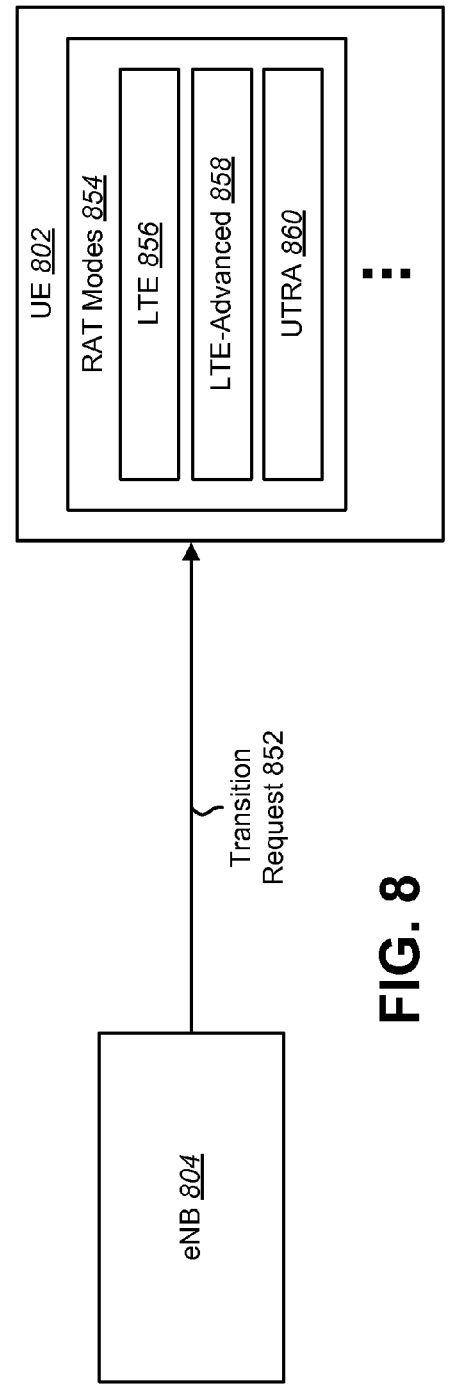
FIG. 8 illustrates another example of a reduced PA mode.

FIG. 8 illustrates another example of a reduced PA mode. In the example that is shown in FIG. 8, the reduced PA mode is a radio access technology (RAT) mode 854. More specifically, the reduced PA mode is an LTE mode 856 (i.e., LTE Release 8). When operating in LTE mode 856, the UE 802 uses only one transmit antenna to transmit uplink signals. Thus, in order to cause the UE 802 to operate in the reduced PA mode, the eNB 804 may ask the UE 802 to transition from LTE-Advanced mode 858 or UTRA mode 860 (or another mode) to LTE mode 856. The UE 802 is configured to support these types of transitions. The process may be similar to the usual inter-RAT handover between LTE-Advanced 858 and LTE 856. Both the downlink and the uplink transition to LTE mode 856 in this case, but the UE 802 can have the benefit of longer battery life through this transition. FIG. 8 shows the eNB 804 sending a transition request 852 to the UE 802.

As discussed above in connection with FIG. 1, a UE 102 may send a preference signal 114 to an eNB 104. The preference signal 114 may include a request for the UE 102 to operate in the reduced PA mode. There are many different ways for a UE 102 to send a preference signal 114 to an eNB 104. For example, the preference signal 114 may be sent via higher layer signaling, such as Media Access Control (MAC) control signaling, via RRC connection re-establishment signaling, via UE capability transfer signaling, via a measurement report, via NAS (Non-Access Stratum) control signaling, etc.

Figure 9:
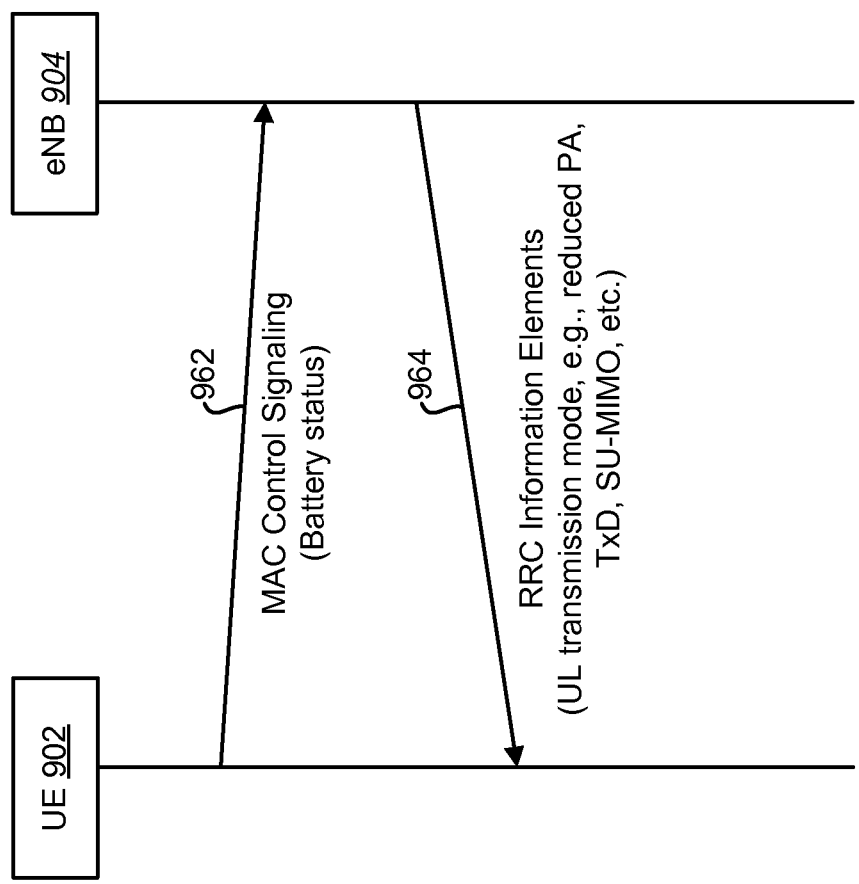
FIG. 9 illustrates an example of a UE sending a preference signal to an eNB via MAC control signaling.

FIG. 9 illustrates an example of a UE 902 sending a preference signal 114 to an eNB 904 via MAC control signaling 962. The UE 902 may send the battery status (e.g., battery voltage, remaining battery charge, current flow given battery type, etc.) as a preference signal 114 via MAC control signaling 962. The eNB scheduler 110 chooses the appropriate uplink transmission mode 318, taking into account the traffic load and channel state information as well as the battery status that it received from the UE 902. The eNB 904 sends the selected uplink transmission mode 318 to the UE 902 via RRC information elements 964.

Figure 10:
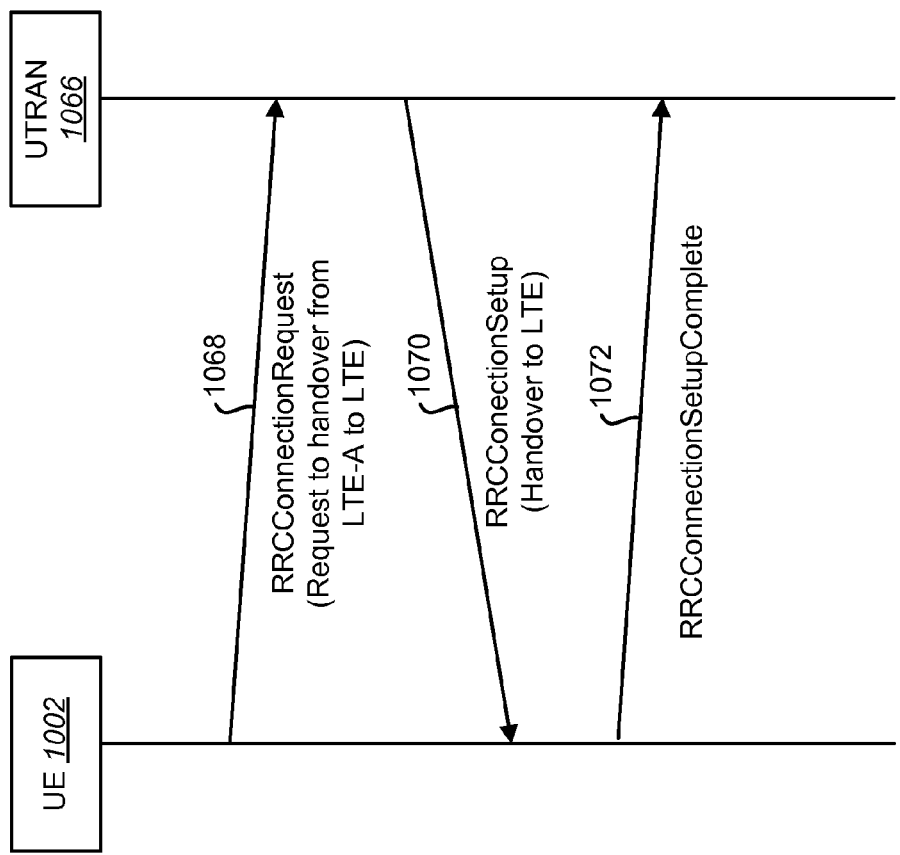
FIG. 10 illustrates an example of a UE sending a preference signal via RRC connection re-establishment signaling.

FIG. 10 illustrates an example of a UE 1002 sending a preference signal 114 via RRC connection re-establishment signaling. A UE 1002 may send a request for handover from LTE-Advanced mode 858 to LTE mode 856 as a preference signal 114 via an RRCConnectionRequest message 1068. The eNB scheduler 110 chooses the appropriate RAT mode 854, taking into account the traffic load and channel state information as well as the request that was received from the UE 1002. The UTRAN (UMTS Terrestrial Radio Access Network) 1066 may send an RRCConectionSetup message 1070 to the UE 1002 to cause the handover to the LTE mode 856 to occur. After the RAT handover, the UE 1002 may send an RRCConnectionSetupComplete message 1072 to the UTRAN 1066.

Figure 11:
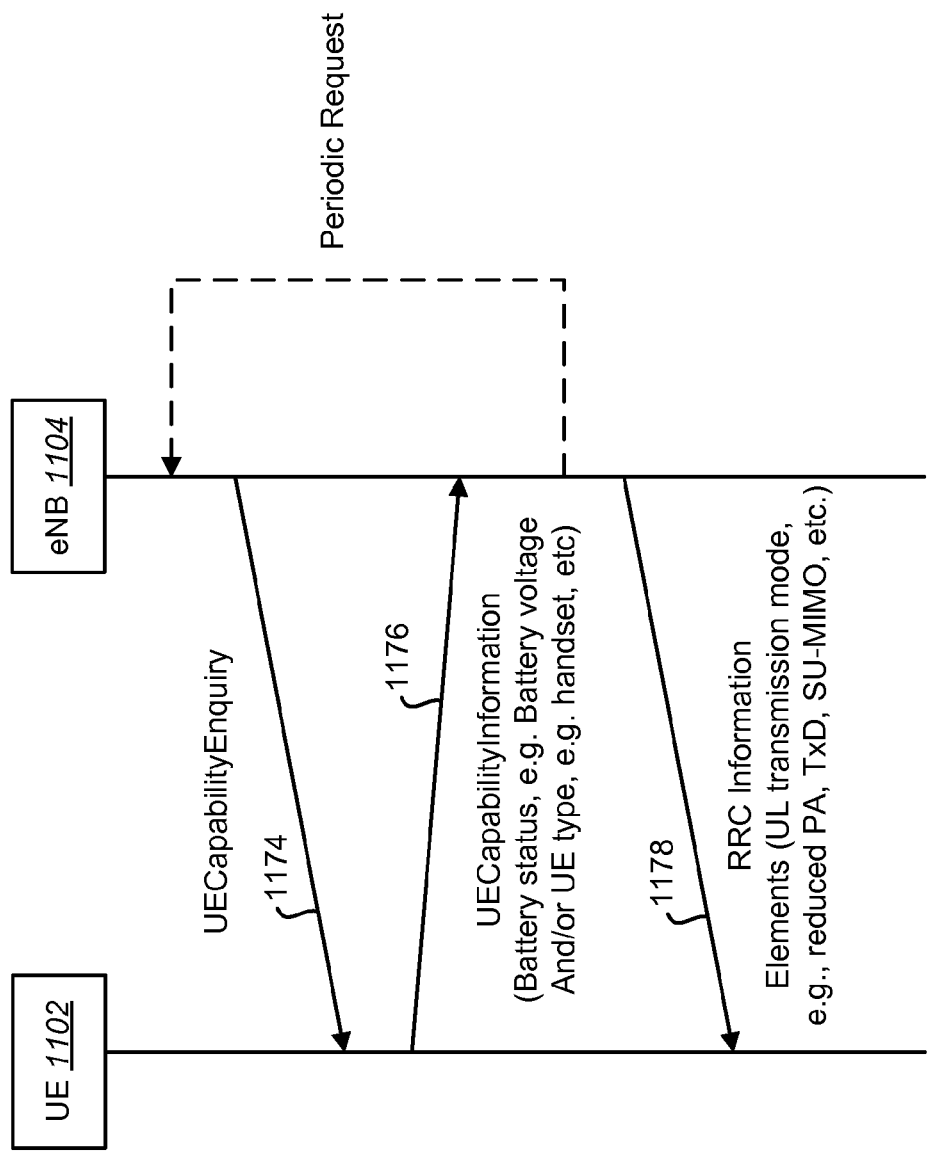
FIG. 11 illustrates an example of a UE sending a preference signal via UE capability transfer signaling.

FIG. 11 illustrates an example of a UE 1102 sending a preference signal 114 via UE capability transfer signaling. First, an eNB 1104 may send a UECapabilityEnquiry message 1174 to the UE 1102. Second, the UE 1102 may send a UECapabilityInformation message 1176 to the eNB 1104. The UECapabilityInformation message 1176 may include the UE type (e.g., handset, PC, etc.) and/or the battery status (e.g., battery voltage, etc.) as a preference signal 114. Third, the eNB scheduler 110 may choose the appropriate UL transmission mode 318, taking into account the traffic load and channel state information as well as the UE type and battery status received from the UE 1102. The eNB 1104 and the UE 1102 may repeat the first three steps periodically. The eNB 1104 may send the selected UL transmission mode 318 via RRC information elements 1178.

Figure 12:
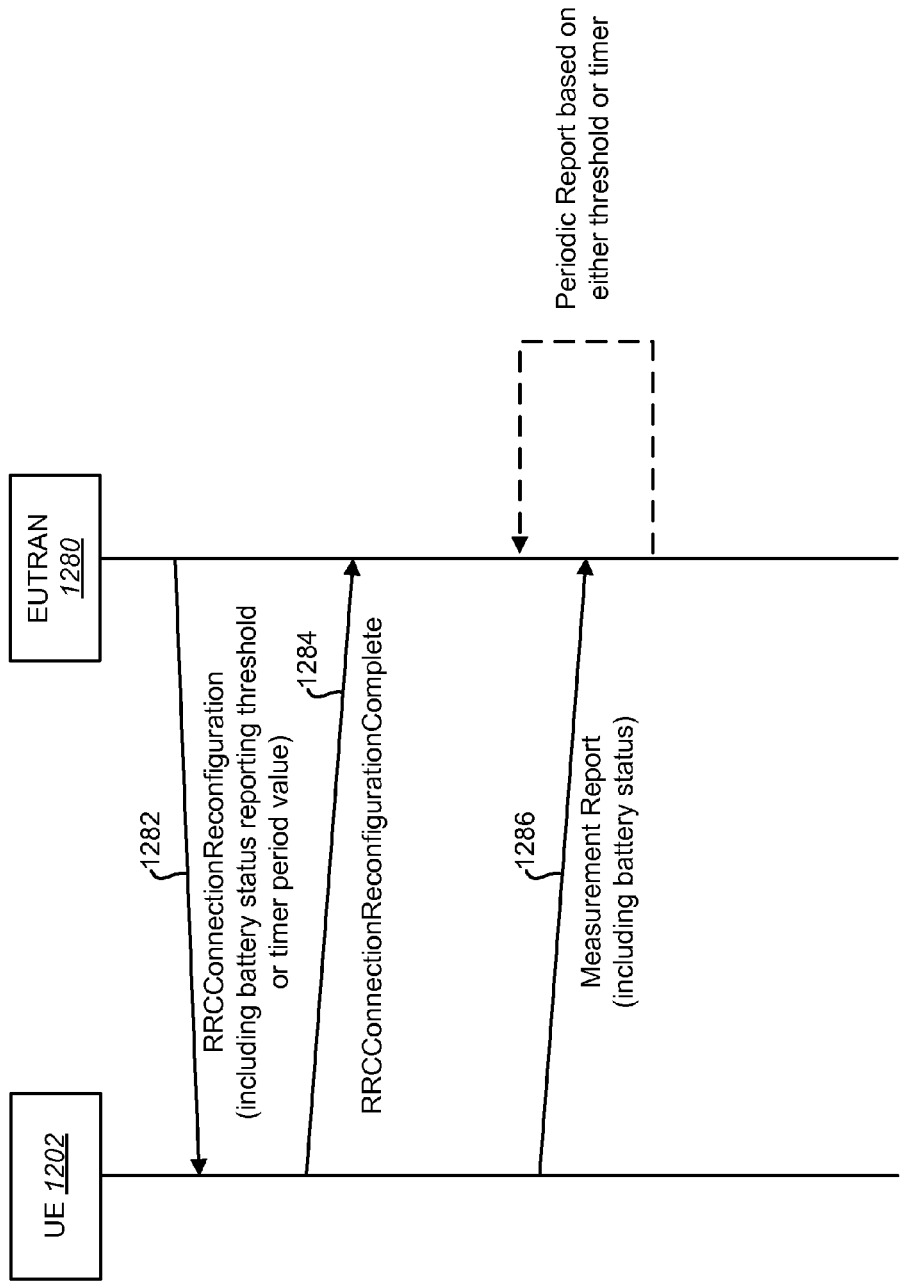
FIG. 12 illustrates an example of a UE sending a preference signal via a measurement report.

FIG. 12 illustrates an example of a UE 1202 sending a preference signal 114 via a measurement report. The EUTRAN (Evolved UTRAN) 1280 may set up a battery status reporting threshold, a timer period value, etc., via an RRCConnectionReconfiguration message 1282. The UE 1202 may send an RRCConectionReconfigurationComplete message 1284 to the UE 1202. The battery status reporting threshold, the timer period value, etc. may be used as a trigger for sending a measurement report 1286. The UE 1202 may send a battery status report as a measurement report 1286 when the battery voltage becomes lower than the configured battery status reporting threshold or the timer period has expired.

Figure 13:
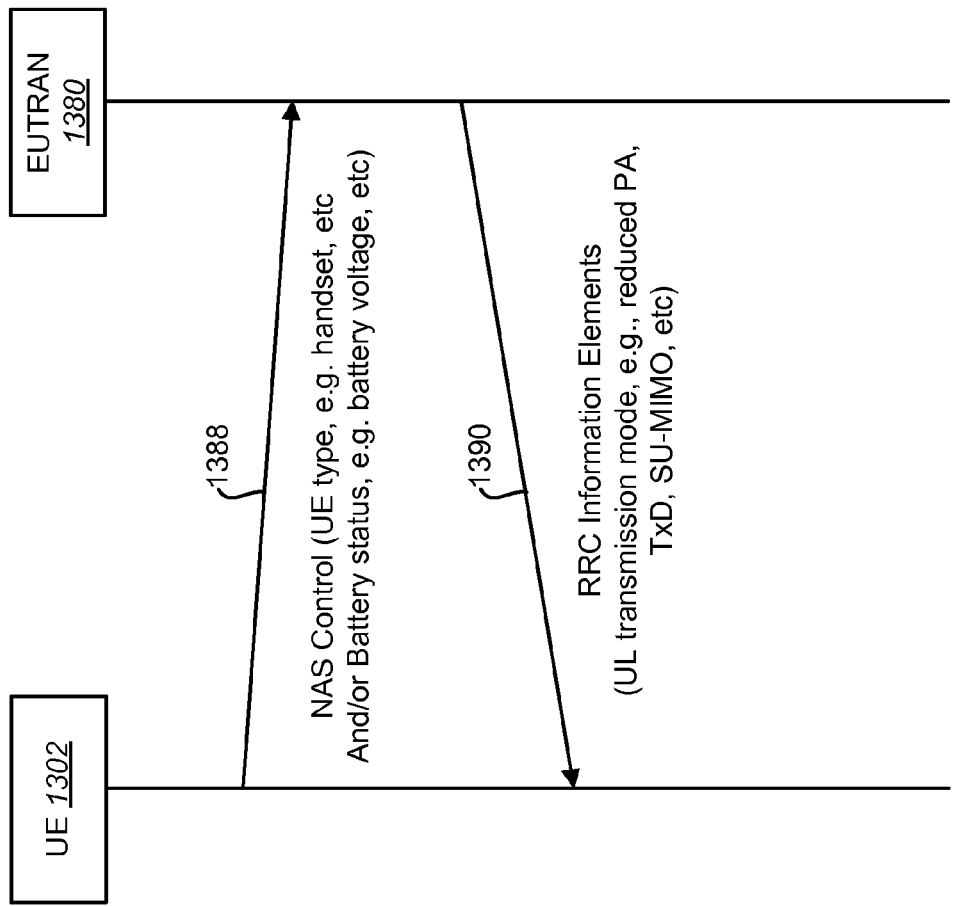
FIG. 13 illustrates an example of a UE sending a preference signal via NAS control signaling.

FIG. 13 illustrates an example of a UE 1302 sending a preference signal 114 via NAS control signaling 1388. The UE 1302 may send the UE type (e.g., handset, PC, etc.) and/or the battery status (e.g., battery voltage, etc.) as a preference signal 114 via NAS control signaling 1388. The eNB scheduler 110 may choose the appropriate UL transmission mode 318, taking into account the traffic load and channel state information as well as the UE type and/or the battery status received from the UE 1302. The eNB 104 (as part of the EUTRAN 1380) may send the selected UL transmission mode 318 via RRC information elements 1390.

As discussed above in connection with FIG. 1, a UE 102 may send capability information 112 to an eNB 104. The capability information 112 may indicate to the eNB 104 that the UE 102 is capable of operating in the reduced PA mode. It may be desirable to send capability information 112 to the eNB 104 because some UEs 102 may not support the reduced PA mode. The capability information 112 may be sent via UE capability transfer signaling, which was discussed above in connection with FIG. 11. The capability information 112 may be included in the UECapabilityInformation 1176 message.

Alternatively, the capability information 112 may be sent via implicit signaling. For example, a UE 102 may indicate to the eNB 104 via UE capability transfer signaling that the UE 102 is capable of supporting multiple PAs 106. In addition, the UE 102 may send the battery status to the eNB 104 by using MAC control signaling, RRC connection re-establishment signaling, UE capability transfer signaling, or NAS control signaling.

Figure 14:
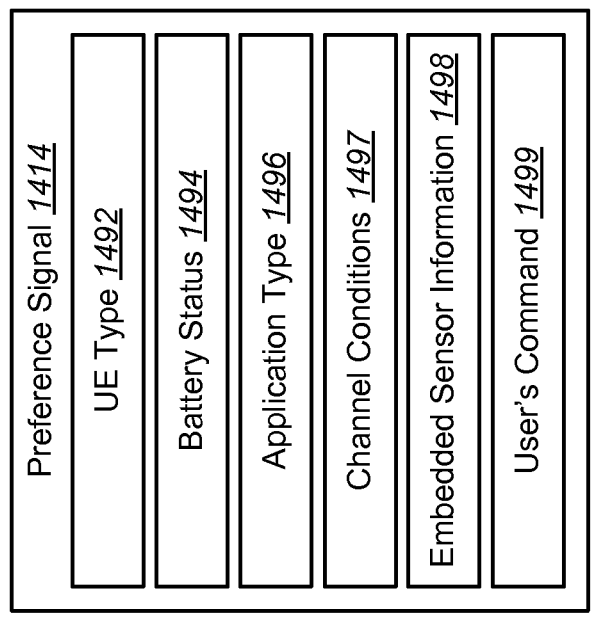
FIG. 14 illustrates an example of a preference signal that may be sent from a UE to an eNB.

FIG. 14 illustrates an example of a preference signal 1414 that may be sent from a UE 102 to an eNB 104. A preference signal 1414 may include the UE type 1492. The UE type 1492 may be, for example, a handset, a PDA, a PC, etc. A preference signal 1414 may also include the battery status 1494. The battery status 1494 may indicate whether the UE 102 has a low battery or not. Alternatively, the battery status 1494 may be a value indicating the battery's present charge. A preference signal 1414 may also include an application type 1496. The application type 1496 may indicate whether the application that is being used by the UE 102 is a voice application, a data application, an E911 call, etc. An E911 signal may be considered to be a preference signal 1414 because it may be beneficial to have a longer battery life when a UE 102 calls to E911.

A preference signal 1414 may include channel conditions 1497. The channel conditions 1497 may include rank information (e.g., Rank1, more than Rank2, etc.). The channel conditions 1497 may also include pathloss information (e.g., whether the difference between downlink signal reception levels for different antennas exceeds a threshold or not). A preference signal 1414 may also include embedded sensor information 1498. For example, a UE 102 may include an accelerometer, in which case the embedded sensor information 1498 may indicate whether the UE 102 is in the horizontal position (landscape mode), the vertical position (portrait mode), etc. A preference signal 1414 may also include a user's command 1499, such as whether the user has requested a longer battery mode (e.g., through a user interface).

As indicated above, a UE 102 may create a preference signal 114 based on evaluating reduced PA mode criteria 116. Several examples of this will now be discussed.

In one example, if the UE type 1492 is "handset" and the battery status 1494 is "low battery" (which may be automatically determined in the manner in which low battery indicators are present in currently deployed cellular phones), then the UE 102 may send a preference signal 114 that tells the eNB 104 that the UE 102 prefers to transmit in the reduced PA mode. In this case, the UE 102 may have only limited battery capacity and the battery may be almost running out.

In another example, if the UE type 1492 is "handset" and the user's command 1499 is "longer battery mode," then the UE 102 may send a preference signal 114 that tells the eNB 104 that the UE 102 prefers the reduced PA mode. In this case, the UE 102 may have only limited battery capacity and the user may want to have a longer battery life rather than a high data rate.

In another example, if the UE type 1492 is "handset" and the channel conditions 1497 are "Rank1," then the UE 102 may send a preference signal 114 that tells the eNB 104 that the UE 102 prefers the reduced PA mode. In this case, the UE 102 may have only limited battery capacity and either antenna 108 on the UE 102 may be covered by the user's hand.

In another example, if the UE type 1492 is "handset" and pathloss information (which may be included in channel conditions 1497) indicates that the difference between the reception level between antennas 108 exceeds a given threshold, then the UE 102 may send a preference signal 114 that tells the eNB 104 that the UE 102 prefers the reduced PA mode. In this case, the UE 102 may have only limited battery capacity and either antenna 108 on the UE 102 may be covered by the hand or similarly obstructed.

In another example, if the UE type 1492 is "PDA" and the application type 1496 is "voice," then the UE 102 may send a preference signal 114 that tells the eNB 104 that the UE 102 prefers the reduced PA mode. For example, if the UE type 1492 is "PDA" and the application type 1496 is "voice" and pathloss information (which may be included in channel conditions 1497) indicates that the difference between the reception level between antennas 108 exceeds a given threshold, then the UE 102 may send a preference signal 114 that tells the eNB 104 that the UE 102 prefers the reduced PA mode. If the user will hold the UE 102 in a different style depending on its application (e.g., a vertical style during a voice connection and a horizontal style during a data connection), the preference signal 114 may indicate that one of the antennas 108 on the UE 102 is covered by the user's hand or is otherwise obstructed. In this case, the reduced PA mode may be beneficial from the perspective of longer battery life.

In another example, if the UE type 1492 is "PDA" and the accelerometer indicates "vertical mode" (via embedded sensor information 1498), then the UE 102 may send a preference signal 114 that tells the eNB 104 that the UE 102 prefers the reduced PA mode. Similar to the above case, if the user will hold the UE 102 in a different style depending on its application (e.g., a vertical style during a voice connection and a horizontal style during a data connection), the preference signal 114 may indicate that one of the antennas 108 on the UE 102 is covered by the user's hand or is otherwise obstructed.

In another example, if the UE type 1492 is "PC" (e.g., as in laptop cards), then the UE 102 may not send a preference signal 114 or the UE 102 may send a preference signal 114 that tells the eNB 104 that the UE 102 does not prefer the reduced PA mode. This may be because a PC has a large battery or can connect to a power outlet. On the other hand, if the laptop is on battery power, and the internal detector in the laptop indicates "low battery," then signaling may be initiated to go into the reduced PA mode.

As indicated above, as part of deciding whether a UE 102 should operate in the reduced PA mode, an eNB 104 may measure 208 channel conditions. This may be accomplished via receiving reference signals, e.g., demodulation reference signals, sounding reference signals, etc. For example, an eNB 104 may measure rank information, e.g., Rank1, more than Rank2, conditioning information (e.g., the ratio of the highest to lowest values of the channel matrix), etc. Also, an eNB 104 may measure CQI (channel quality information), PMI (preceding matrix indexes), pathloss information (e.g., whether the difference between downlink signal reception levels for different antennas 108 exceeds a threshold or not), etc. An eNB 104 may also measure the UE's 102 application type 1496 (e.g., voice, data, etc.).

As indicated above, the eNB scheduler 110 may determine 210 whether a UE 102 should operate in reduced PA mode. In making this determination, the eNB scheduler 110 may take into account a preference signal 114 received from the UE 102, capability information 112 received from the UE 102, eNB 104 measurement results, traffic information (for the cell and/or for the UE 102), etc. Several examples of this will now be discussed.

In one example, the eNB scheduler 110 may select the reduced PA mode for a UE 102 when the UE 102 sends a preference signal 114 that tells the eNB 104 that the UE 102 prefers reduced PA mode. In this case, the preference signal 114 directly affects the behavior of the eNB scheduler 110.

In another example, the eNB scheduler 110 may add a reduced PA mode (e.g., one antenna mode 320, antenna selection mode 546) and remove the transmit diversity mode 322 for a UE 102 to the set of transmission mode candidates when the UE 102 sends a preference signal 114 that tells the eNB 104 that the UE 102 prefers the reduced PA mode. Then, the eNB scheduler 110 may select the appropriate transmission mode 318 based on eNB 104 measurement results, e.g., CQI, PMI, rank information and/or pathloss. In this case, the preference signal 114 may provide the function of narrowing down the eNB scheduler's 110 choice of transmission modes 318.

In another example, the eNB scheduler 110 may select the reduced PA mode for a UE 102 when the UE 102 sends a preference signal 114 that tells the eNB 104 that the UE 102 prefers the reduced PA mode and pathloss information in the eNB 104 measurement results indicates that the difference between the UE's 102 antenna levels exceeds a given threshold. In this case, either antenna 108 on the UE 102 may be covered by the user's hand or may be otherwise obstructed so that the eNB scheduler 110 may select the reduced PA mode.

In another example, the eNB scheduler 110 may select the reduced PA mode for a UE 102 when the UE's 102 traffic is voice traffic and the pathloss information in the eNB 104 measurement results indicates that the difference between the UE's 102 antenna levels exceeds a given threshold.

In another example, the eNB scheduler 110 may select the reduced PA mode for a UE 102 when the UE 102 sends a preference signal 114 that indicates to the eNB 104 that the UE 102 prefers the reduced PA mode, the cell traffic is low, and the pathloss information in the eNB 104 measurement results indicates that the difference between the UE's 102 antenna levels exceeds a given threshold.

Figure 15:
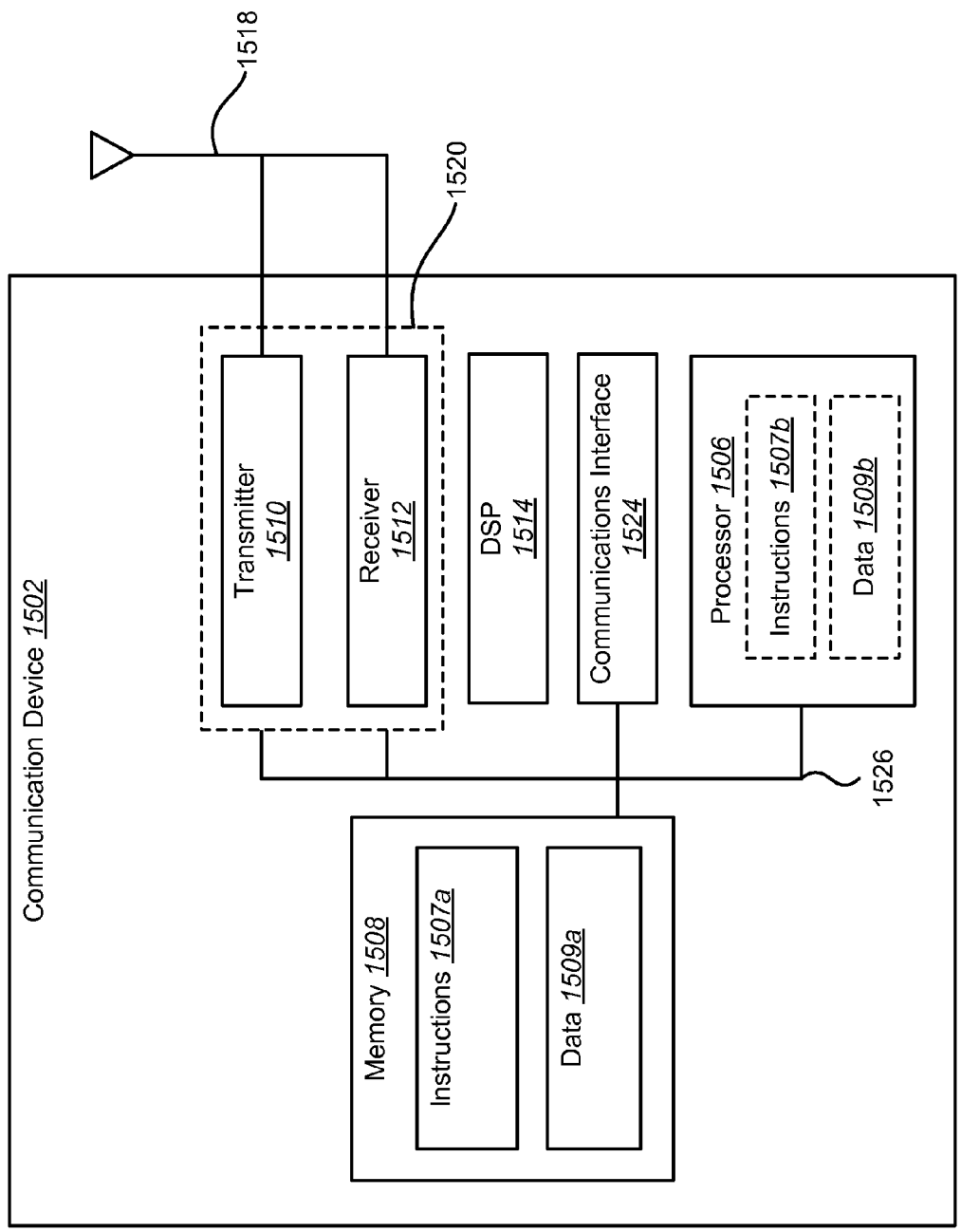
FIG. 15 illustrates various components that may be utilized in a communication device.

FIG. 15 illustrates various components that may be utilized in a communication device 1502. The communication device 1502 may be a UE or a base station. The communication device 1502 includes a processor 1506 that controls operation of the communication device 1502. The processor 1506 may also be referred to as a CPU. Memory 1508, which may include both read-only memory (ROM), random access memory (RAM) or any type of device that may store information, provides instructions 1507a and data 1509a to the processor 1506. A portion of the memory 1508 may also include non-volatile random access memory (NVRAM). Instructions 1507b and data 1509b may also reside in the processor 1506. Instructions 1507b loaded into the processor 1506 may also include instructions 1507a from memory 1508 that were loaded for execution by the processor 1506. The instructions 1507 may be executed by the processor 1506 to implement the methods disclosed herein.

The communication device 1502 may also include a housing that contains a transmitter 1510 and a receiver 1512 to allow transmission and reception of data. The transmitter 1510 and receiver 1512 may be combined into a transceiver 1520. An antenna 1518 is attached to the housing and electrically coupled to the transceiver 1520. Additional antennas may also be used.

The various components of the communication device 1502 are coupled together by a bus system 1526, which may include a power bus, a control signal bus, and a status signal bus, in addition to a data bus. However, for the sake of clarity, the various buses are illustrated in FIG. 15 as the bus system 1526. The communication device 1502 may also include a digital signal processor (DSP) 1514 for use in processing signals. The communication device 1502 may also include a communications interface 1524 that provides user access to the functions of the communication device 1502. The communication device 1502 illustrated in FIG. 15 is a functional block diagram rather than a listing of specific components.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A user equipment (UE), comprising:
multiple antennas transmitting and receiving signals, wherein:
the UE supports at least a one antenna mode and a closed loop single-user multiple-input multiple-output (SU-MIMO) mode as uplink transmission modes;
a subset of the multiple antennas are used to transmit uplink signals in the one antenna mode; and
said uplink transmission modes are configured via Radio Resource Control (RRC) signaling.

2. The UE of claim 1, wherein said one antenna mode is an antenna selection mode.

3. The UE of claim 1, comprising a transmitter to transmit sounding reference signals.

4. The UE of claim 1, wherein the UE sends a preference signal to an e-Node B (eNB), wherein the preference signal comprises a request for the UE to operate in the one antenna mode.

5. The UE of claim 4, wherein the preference signal is sent via Media Access Control (MAC) control signaling.

6. The UE of claim 4, wherein the preference signal is sent via Radio Resource Control (RRC) connection re-establishment signaling.

7. The UE of claim 4, wherein the preference signal is sent via UE capability transfer signaling.

8. The UE of claim 4, wherein the preference signal is sent via a measurement report.

9. The UE of claim 4, wherein the preference signal is sent via Non-Access Stratum (NAS) control signaling.

10. The UE of claim 4, wherein the preference signal comprises at least one of UE type, battery status, and application type.

11. The UE of claim 1, wherein the UE sends capability information to an e-Node B (eNB) via UE capability transfer signaling.

12. The UE of claim 1, wherein the UE sends capability information to an e-Node B (eNB).

13. The UE of claim 1, wherein the UE creates a preference signal based on evaluating one antenna mode criteria.

14. The UE of claim 13, wherein the one antenna mode criteria comprises pathloss information.

15. The UE of claim 13, wherein the one antenna mode criteria comprises battery status.

16. The UE of claim 13, wherein the one antenna mode criteria comprises an indicator of an E911 call.

17. A method for uplink transmission, wherein:
a user equipment (UE) supports at least a one antenna mode or a closed loop single-user multiple-input multiple-output (SU-MIMO) mode as an uplink transmission mode;
a subset of the multiple antennas are used to transmit uplink signals in the one antenna mode; and
the uplink transmission mode is configured via Radio Resource Control (RRC) signaling.

18. The method of claim 17, further comprising transmitting sounding reference signals.

19. An enhanced Node B (eNB), wherein:
the eNB configures a user equipment (UE) to operate in at least a one antenna mode or a closed loop single-user multiple-input multiple-output (SU-MIMO) mode as an uplink transmission mode;
a subset of the UE's multiple antennas are used to transmit uplink signals in the one antenna mode; and
the eNB configures the UE to operate in the uplink transmission mode via Radio Resource Control (RRC) signaling.

20. The eNB of claim 19, wherein the eNB also measures channel conditions.

* * * * *

UNITED STATES PATENT AND TRADEMARK OFFICE
CERTIFICATE OF CORRECTION

| | | |
|---|---|---|
| PATENT NO. | : 8,515,363 B2 | |
| APPLICATION NO. | : 12/488431 | |
| DATED | : August 20, 2013 | |
| INVENTOR(S) | : Kimihiko Imamura et al. | |

It is certified that error appears in the above-identified patent and that said Letters Patent is hereby corrected as shown below:

In the Specification

In column 8, lines 25–26 please delete "(preceding matrix indexes)" and replace it with --(precoding matrix indexes)--.

Signed and Sealed this
Seventeenth Day of December, 2013

Margaret A. Focarino
*Commissioner for Patents of the United States Patent and Trademark Office*